(12) United States Patent
Kwon et al.

(10) Patent No.: US 7,091,287 B2
(45) Date of Patent: *Aug. 15, 2006

(54) NANOPORE FORMING MATERIAL FOR FORMING INSULATING FILM FOR SEMICONDUCTORS AND LOW DIELECTRIC INSULATING FILM COMPRISING THE SAME

(75) Inventors: Won-Jong Kwon, Daejeon (KR); Min-Jin Ko, Daejeon (KR); Gwi-Gwon Kang, Seoul (KR); Dong-Seok Shin, Seoul (KR); Myung-Sun Moon, Daejeon (KR); Jung-Won Kang, Seoul (KR); Hae-Young Nam, Cheongju (KR); Young-Duk Kim, Daejeon (KR); Bum-Gyu Choi, Daejeon (KR)

(73) Assignee: LG Chem, Ltd. (KR)

( * ) Notice: Subject to any disclaimer, the term of this patent is extended or adjusted under 35 U.S.C. 154(b) by 197 days.

This patent is subject to a terminal disclaimer.

(21) Appl. No.: 10/331,003

(22) Filed: Dec. 27, 2002

(65) Prior Publication Data
US 2004/0126595 A1    Jul. 1, 2004

(30) Foreign Application Priority Data
Dec. 27, 2001    (KR)    ............ 10-2001-0086333
Dec. 12, 2002    (KR)    ............ 10-2002-0079063

(51) Int. Cl.
*C08L 83/04* (2006.01)
(52) U.S. Cl. ............ 525/474; 521/61; 528/423
(58) Field of Classification Search ............ 521/61; 525/474; 528/423
See application file for complete search history.

(56) References Cited

U.S. PATENT DOCUMENTS

| 5,700,844 | A |   | 12/1997 | Hedrick et al. ............ 521/77 |
| 5,810,912 | A | * | 9/1998  | Akiyama et al. ............ 96/11 |
| 6,126,733 | A |   | 10/2000 | Wallace et al. ............ 106/287.16 |
| 6,271,273 | B1 | * | 8/2001  | You et al. ............ 521/61 |
| 6,391,932 | B1 | * | 5/2002  | Gore et al. ............ 521/61 |
| 6,420,441 | B1 | * | 7/2002  | Allen et al. ............ 521/77 |
| 6,743,471 | B1 | * | 6/2004  | Ko et al. ............ 427/226 |
| 6,806,161 | B1 | * | 10/2004 | Ko et al. ............ 438/409 |

OTHER PUBLICATIONS

Advanced Materials; Research News; "Templating Nanoporosity in Thin-Film Dielectric Insulators"; Authors: James L. Hedrick, Robert D. Miller, Craig J. Hawker, Kenneth R. Carter, Willi Volksen, Do Y. Yoon and Mikael Trollsas; pp. 1049-1053; 1998.

* cited by examiner

Primary Examiner—Margaret G. Moore
(74) Attorney, Agent, or Firm—Cantor Colburn LLP

(57) ABSTRACT

The present invention relates to a nanopore-forming material for forming an insulating film for a semiconductor device, and more particularly to a nanopore-forming organic material containing a triazine functional group and preparation thereof, and a composition for forming an insulating film for a semiconductor device comprising the same, an insulating film using the same, and a manufacturing process thereof.

The pore-forming material of the present invention is easy to synthesize, and the molecular weight, molecular structure, and microenvironment thereof are easy to control, and thus it is suitable for a nanopore-forming material.

6 Claims, 1 Drawing Sheet

NANOPORE FORMING MATERIAL FOR FORMING INSULATING FILM FOR SEMICONDUCTORS AND LOW DIELECTRIC INSULATING FILM COMPRISING THE SAME

DETAILED DESCRIPTION OF THE INVENTION

Objects of the Invention

Figure 1:
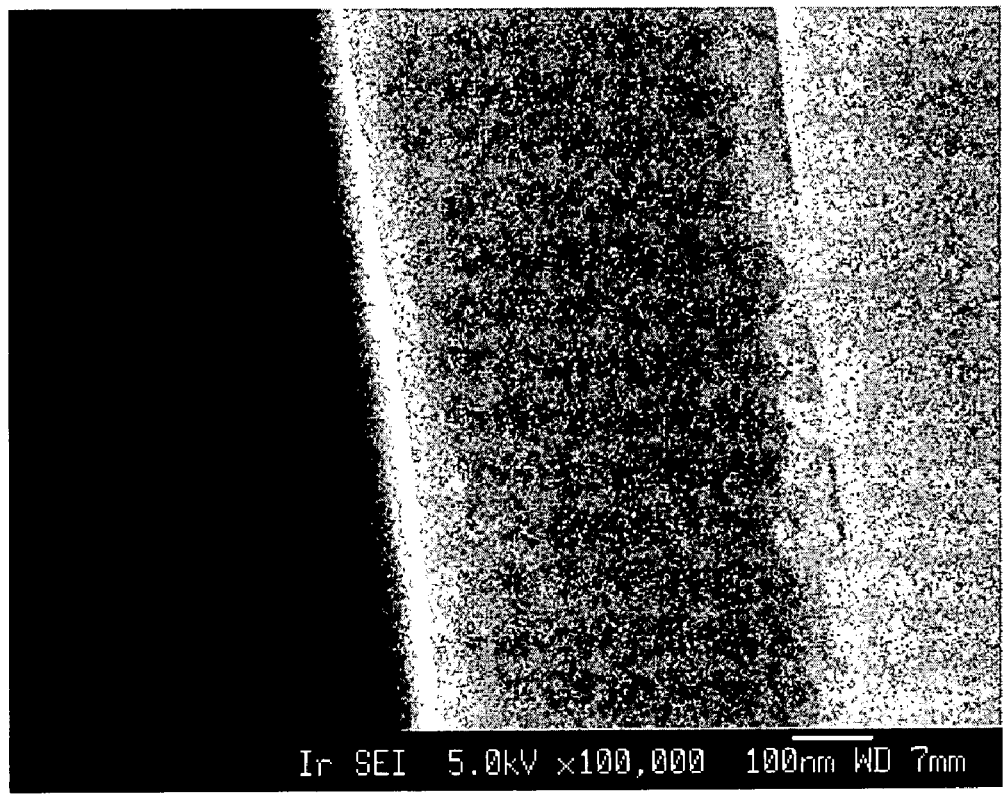
FIG. 1 is an electron microscope photograph of the insulating film comprising a nanopore-forming material of Example 1 of the present invention.

Field of the Invention and Description of the Related Art

The present invention relates to a nanopore forming material for forming an insulating film for a semiconductor, and more particularly to a nanopore forming material having a triazine-based functional group, of which the molecular weight, molecular structure, and microenvironment are easy to control, and that is easy to prepare and thus mass production is possible, and preparation thereof, a coating composition for forming an insulating film for a semiconductor device comprising the same, and an insulating film obtained by coating it with the material, and preparation thereof.

Recently, as the integrity of semiconductor devices has increased, the line width of wiring interconnecting the inner parts of devices has rapidly decreased, and around the year 2003 high density devices using a circuit line width of 0.1 µm are expected to be developed. Generally, speed of a semiconductor device is proportional to the switching speed of transistors and the signal transmission speed, and the signal transmission speed is determined by RC delay represented by a product of resistance of a wiring material and capacitance of an interlayer insulating film. As the dimension of semiconductor devices lessens as below 0.25 µm, a propagation delay, crosstalk noise, and power consumption caused by RC (Resistance-capacitance) coupling are more important. A decrease of the thickness of metal wire increase a resistance of the wire, and a narrow width of the metal wire increase a capacitance between the metal wires. Inter-connecting delay plays a prominent part of total delay and decrease total performance of a chip, though the switching speed accelerates as the least width of the metal wire decrease. Therefore, in order to manufacture a high-speed chip, low resistance conductors and a low dielectric insulating material should be used. Additionally, the use of a low dielectric material can decrease power consumption and remarkably decrease cross-talk between metal wiring, as well as increase the speed of the semiconductor devices.

Recently, IBM marketed a semiconductor test product that does not use conventional aluminum wiring, but rather uses copper wiring having high electric conductivity that shows performance increases of 20% or more. However, a semiconductor device using a low dielectric material, particularly an insulating material having a dielectric constant of 2.5 or less, is difficult to commercialize due to deficiencies in development of appropriate materials.

The most common interlayer insulating material for the existing semiconductor devices such as ICs and for LSI, etc. is $SiO_2$, which has a dielectric constant of 4.0, and silicate doped with fluorine ($F-SiO_2$) as a low dielectric material is applied for some devices. However, in the case of $F-SiO_2$, if the fluorine content is 6% or more, it becomes thermally unstable, and thus it is difficult to lower the dielectric constant to 3.5 or less. Recently, in order to solve this problem, various organic and inorganic polymers having low polarity and thermal stability have been suggested.

As organic polymers having low dielectric constants, polyimide resin, polyarylene ether resin, and aromatic hydrocarbon resin, etc. are known. Most of these organic polymers have dielectric constants of 2.6~3.2, and they generally have low glass transition temperatures, remarkably low elasticity compared to $SiO_2$, and very high linear expansion coefficients. Such organic polymers having low thermal stability and elasticity and high linear expansion coefficients may deteriorate confidence in devices or wiring substrates.

Recently, in order to solve these problems, development of organosilicate polymers using an alkoxysilane-based compound, which are more thermally stable than the above-mentioned organic polymers, has been undertaken. The methods used form an organosilicate film by hydrolyzing and condensing organosilane, and curing it. Methyl or hydrosilsesquioxane is thermally stable at 450° C., but the polysilsesquioxane has a comparatively high dielectric constant of 2.7 or more, and its mechanical properties are not satisfactory.

Recently, in spite of various problems, organic polymers and organosilicate polymers having specific dielectric constants of 2.5~3.0 have entered the common use stage, and studies on very low dielectric materials with specific dielectric constants of 2.5 or less are being undertaken. As low dielectric materials with dielectric constants of 2.5 or less, fluorine-containing resins and porous membranes, etc. have been suggested, but a material having sufficient properties for an interlayer insulating film for LSI has not been developed. The fluorine resin has a low dielectric constant of about 2.0, but it is not sufficient at present semiconductor process temperatures because its thermolysis temperature is 400° C. or less. Therefore, porous membranes introducing pores into low dielectric materials with dielectric constants of 2.5~3.0 have attracted attention as technology for realizing specific dielectric constants of 2.5 or less.

As a conventional technology for forming a porous membrane, U.S. Pat. No. 5,700,844 has suggested dispersing a polymer precursor and polymer particles to cure the polymer precursor, and then secondary heating the polymer particles at a high temperature to remove them. However, with this method it is difficult to form small pores of a few nano's because it uses polymer particles to form the pores.

In addition, in Adv. Mater. 1998, Vol. 10, No. 13, 1049, a porous super dielectric material has been prepared by dispersing an organosilicate polymer and a thermolizable polymer, curing the organosilicate, and secondary heating at a high temperature to remove organic polymer. However, when using hyperbranched or dendrimer polymers for forming pores, it is difficult to control molecular weight, molecular weight distribution, and microstructure, etc., and thus it is difficult to form micropores with a uniform size. Additionally, activation-inactivation is generally required, and purification is difficult, so mass production is not easy and cost is high.

U.S. Pat. No. 6,126,733 has used a solvent having a high boiling point instead of an organic polymer for forming pores. In this method, a solvent with a high boiling point is layer-separated to nano size while passing through the curing process, and the solvent with a high boiling point is evaporated to form pores while passing through the secondary curing process. However, in this method it is difficult to control layer separation of the solvent with a high boiling point during the gelling and film-forming processes.

[Technical Subject of the Invention]

The present invention is made in consideration of the problems of the prior art, and it is an object of the present invention to provide a low dielectric nanopore-forming material that can make speed of a semiconductor device high, decrease power consumption, and remarkably decrease cross-talk between metal wiring, and that can be used for a very low dielectric wiring interlayer insulating film.

It is another object of the present invention to provide a process for preparing the nanopore-forming material that is easy to synthesize, in which the molecular weight, molecular structure, and microenvironment are easy to control, and thus that can decrease density of an insulating film.

It is another object of the present invention to provide a coating composition for forming an insulating film comprising the nanopore-forming material, and an insulating film for a semiconductor device obtained therefrom and a process for manufacturing the same.

[Technical Features of the Invention]

In order to achieve these objects, the present invention provides a nanopore-forming material for forming an insulating film for a semiconductor device comprising a triazine-based functional group, wherein the nanopore-forming material is selected from the group consisting of a triazine-based functional group containing linear organic molecules or polymers, crosslinked organic polymers, hyperbranched organic molecules or polymers, dendrimer organic material, and a mixture thereof, which is thermolyzed at 200 to 450° C., and has a pore size of 0.5 to 100 nm.

The present invention also provides a coating composition for forming an insulating film for a semiconductor device comprising:

a) a triazine-based functional group-containing a nanopore-forming material;

b) an organosilicate polymer comprising a hydrolysis-condensation polymerization product of a silane compound of one or more kinds selected from the group consisting of a compound represented by the following Chemical Formula 4, a compound represented by the following Chemical Formula 5, and a compound represented by the following Chemical Formula 6; and c) an organic solvent:

$$SiR^1_p R^2_{4-p}$$ [Chemical Formula 4]

wherein $R^1$ is a hydrogen, fluorine, aryl, vinyl, allyl, or straight or branched C1–4 alkyl substituted or unsubstituted with fluorine; $R^2$, which is a hydrolysable group, is an acetoxy, hydroxy, or straight or branched C1–4 alkoxy group; and p is an integer of 0 to 2, $$R^3_q R^4_{3-q} Si-M-SiR^5_r R^6_{3-r}$$ [Chemical Formula 5]

wherein $R^3$ and $R^5$ are independently or simultaneously a hydrogen, fluorine, aryl, vinyl, allyl, or straight or branched C1–4 alkyl substituted or unsubstituted with fluorine; $R^4$ and $R^6$ are independently or simultaneously acetoxy, hydroxy, or straight or branched C1–4 alkoxy; M is C1–6 alkylene or phenylene; and q and r are independently integers of 0 to 2,

[Chemical Formula 6]

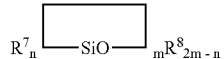

wherein $R^7$ is a hydrogen, fluorine, aryl, vinyl, allyl, or straight or branched C1–4 alkyl substituted or unsubstituted with fluorine; n and m are independently or simultaneously integers of 3 to 10; $R^8$ is $-(CH_2)_a SiR^9_b R^{10}_{3-b}$ (wherein $R^9$ is a hydrogen, fluorine, aryl, vinyl, allyl, or straight or branched C1–4 alkyl substituted or unsubstituted with fluorine, $R^{10}$ is an acetoxy, hydroxy, or straight or branched C1–4 alkoxy substituted or unsubstituted by fluorine; a is an integer of 1 to 6; and b is an integer of 0 to 2.)

The present invention also provides a process for manufacturing an insulating film for a semiconductor device, comprising the steps of:

a) providing a solution of a composition for forming an insulating film, comprising i) an organosilicate polymer comprising a hydrolysis-condensation polymerization product of a silane compound of one or more kinds selected from the group consisting of compounds represented by the above Chemical Formula 4, Chemical Formula 5, and Chemical Formula 6, ii) a triazine-based functional group containing a nanopore-forming material, and iii) an organic solvent;

b) coating the a) solution on a substrate of a semiconductor device to form an insulating film; and c) drying and firing the insulating film formed in step b).

The present invention also provides an insulating film for a semiconductor device manufactured by the above process.

The present invention also provides a semiconductor device comprising the above insulating film.

The present invention will now be explained in detail.

The present invention provides a nanopore-forming material having a triazine-based functional group that can be thermolyzed at a specific temperature and is easily prepared as a pore-forming material, and preparation thereof, a coating composition for forming an insulating film comprising the same, and a copolymerized organosilicate polymer interlayer insulating film manufactured by coating the composition and curing it, and preparation thereof.

Generally, organic polymers used for conventional insulating films have been very difficult to control with respect to shape, size, functional groups, and microenvironments thereof. Representative examples of polymers of which the pore size and microenvironment can be exactly controlled include dendrimers, but in the case of dendrimer synthesis by the conventional method, an activation-inactivation process of functional groups is required in a process of sequentially increasing the number of molecular generations, and thus synthesis is difficult and cost is high.

In order to solve these problems, the present invention provides an organic material for forming nanopores using triazine trichloride. The triazine trichloride shows different reactivity according to substitution degree, temperature, and kind of nucleophile. Using the properties of triazine trichloride, dendrimer, hyperbranched, linear organic polymers, etc. can be easily prepared without an activation-inactivation process of functional groups. Specifically, organic polymers of nano size can be prepared by optionally controlling the shape and size of molecule and functional groups. The nanopore-forming material prepared according to the process of the present invention is more easily synthesized than conventional organic material, and it is easy to control the molecular weight, molecular structure, and microenvironment thereof, and thus it is suitable for a micropore-forming material.

The pore-forming material for forming an insulating film of the present invention can uniformly distribute pores of a specific size in an insulating film. The size, distribution of pores, pore-forming temperature, etc. are determined by the kind of pore-forming material, and these largely influence the insulating properties of the insulating film. The size of pores of the nanopore-forming material is preferably 0.5 to 100 nm, and more preferably 0.5 to 50 nm.

Additionally, the nanopore-forming organic material may further comprise an alkoxysilane functional group capable of reacting with organosilicate at the end of a molecule or inside the molecule.

The nanopore-forming material that can be used in the present invention includes compounds of the following Chemical Formulae 1 to 3. The compound of Chemical Formula 1 is a linear and hyperbranched organic material, and those of Chemical Formulae 2 and 3 are dendrimer organic materials. However, the present invention does not limit the nanopore-forming material to the following examples.

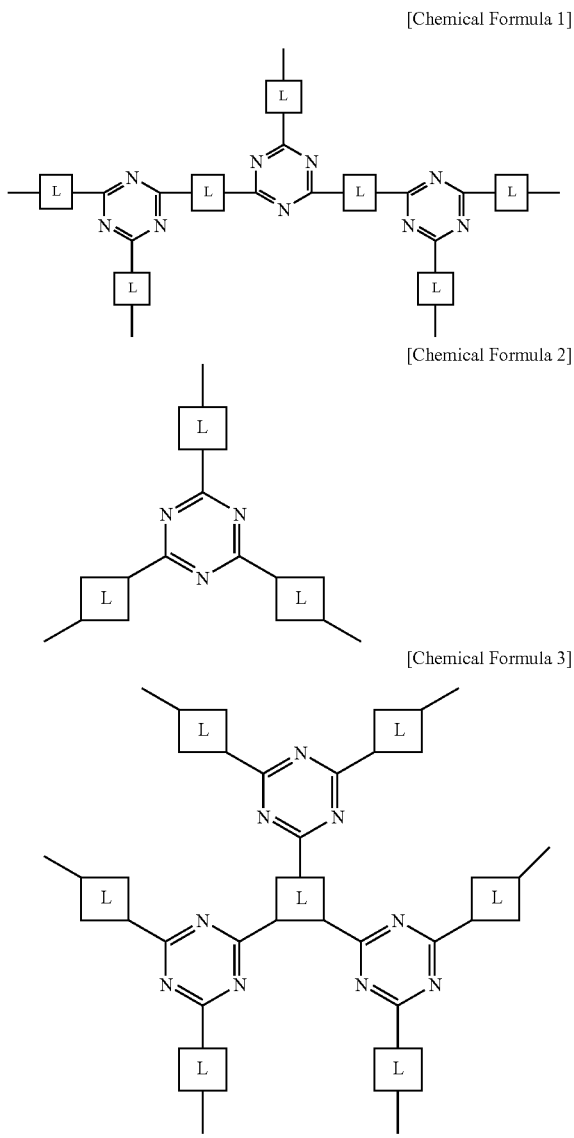

[Chemical Formula 1]

[Chemical Formula 2]

[Chemical Formula 3]

wherein L is an organic molecule or organic polymer that can be thermolyzed at 200 to 450° C.

The present invention also provides a composition for forming an insulating film for a semiconductor device comprising the triazine-based functional group containing a nanopore-forming material. The composition for forming an insulating film of the present invention comprises the nanopore-forming material, an organosilicate polymer, and an organic solvent.

The nanopore-forming material has a function of lowering the density of an insulating film. The contents of the nanopore-forming material are 2 to 80 wt % of the total composition, and preferably 5 to 70 wt %. If the contents are less than 2 wt %, the effects for lowering the dielectric constant are insignificant, and if they exceed 80 wt %, the strength of the porous film is insufficient.

In addition, the composition for forming an insulating film of the present invention comprises a matrix-forming material. As the matrix-forming material, an organic, inorganic, or organic/inorganic complex that can be applied to the semiconductor high-temperature process and that has a dielectric constant of 3.5 or less can be used, and preferably, an organosilicate oligomer and polymer that can be prepared from a monomer consisting of silicon, carbon, oxygen, and hydrogen are used, and more preferably, an organosilicate polymer in which carbon is contained in silicon in a side chain or bridge between silicon atoms is used.

Organosilicate polymers usable in the present invention are not specifically limited, and preferably those having a matrix dielectric constant of 3.5 or less, more preferably those having a dielectric constant of 3.2 or less, and still more preferably 3.0 or less after final curing are used.

A process for preparing an organosilane compound and polymer usable in the present invention is not specifically limited. For example, a polymer can be prepared by hydrolysis-condensation through reacting a silane compound of one or more kinds selected from the group consisting of compounds of the following Chemical Formulae 4, 5, and 6.

$$SiR^1_p R^2_{4-p}$$ [Chemical Formula 4]

(wherein $R^1$ is a hydrogen, fluorine, aryl, vinyl, allyl, or straight or branched C1–4 alkyl substituted or unsubstituted with fluorine; $R^2$, which is a hydrolysable group, is an acetoxy, hydroxy, or straight or branched C1–4 alkoxy; and p is an integer of 0 to 2.)

$$R^3_q R^4_{3-q} Si-M-SiR^5_r R^6_{3-r}$$ [Chemical Formula 5]

(wherein $R^3$ and $R^5$ are independently or simultaneously a hydrogen, fluorine, aryl, vinyl, allyl, or straight or branched C1–4 alkyl substituted or unsubstituted with fluorine; $R^4$ and $R^6$ are independently or simultaneously acetoxy, hydroxy, or straight or branched C1–4 alkoxy; M is C1–6 alkylene or phenylene; and q and r are independently or simultaneously integers of 0 to 2)

[Chemical Formula 6]

$$R^7_n \boxed{\phantom{XX}} SiO \boxed{\phantom{XX}}_m R^8_{2m-n}$$

(wherein $R^7$ is a hydrogen, fluorine, aryl, vinyl, allyl, or straight or branched C1–4 alkyl substituted or unsubstituted with fluorine; n and m are independently or simultaneously integers of 3 to 10; and $R^8$ is $-(CH_2)_a SiR^9_b R^{10}_{3-b}$ (wherein $R^9$ is a hydrogen, fluorine, aryl, vinyl, allyl or straight or branched C1–4 alkyl substituted or unsubstituted with fluorine; $R^{10}$ is acetoxy, hydroxy, or straight or branched C1–4 alkoxy substituted or unsubstituted with fluorine; a is an integer of 1 to 6; and b is an integer of 0 to 2))

The organosilicate polymer can be prepared with a specific molecular weight by adding water and a catalyst to a silane compound of one or more kinds selected from the group consisting of compounds of the above Chemical Formulae 1, 2, and 3 in the presence of an organic solvent or in a bulk phase, and hydrolysis-condensation reacting. The mixing order of the silane compounds of the above Chemical Formula 1, Chemical Formula 2, and Chemical Formula 3 is not specifically limited, and the total amount may be mixed from the beginning and hydrolysis-condensation reacted, or a specific amount may be first hydrolysis-condensation reacted to a specific molecular weight and then the remaining amount may be added and further reacted.

The organic solvent used in the present invention is not specifically limited, if the silane compound, water, and catalyst are appropriately mixed, and if significant difficulty in layer separation is not caused in the hydrolysis-condensation reaction. As examples, the organic solvent includes aliphatic hydrocarbons such as n-pentane, i-pentane, n-hexane, i-hexane, 2,2,4-trimethylpentane, cyclohexane, methylcyclohexane, etc.; aromatic hydrocarbons such as benzene, toluene, xylene, trimethyl benzene, ethyl benzene, methylethyl benzene, etc.; alcohol solvents such as methyl alcohol, ethyl alcohol, n-propanol, i-propanol, n-butanol, i-butanol, sec-butanol, t-butanol, 4-methyl 2-pentanol, cyclohexanol, methylcyclohexanol, glycerol, etc.; ketone solvents such as acetone, methylethyl ketone, methyl n-propyl ketone, methyl n-butyl ketone, methyl i-butylketone, diethylketone, cyclohexanone, methylcyclohexanone, acetylacetone, etc.; ether solvents such as tetrahydrofuran, 2-methyl tetrahydrofuran, ethylether, n-propylether, i-propylether, n-butylether, diglyme, dioxin, dimethyldioxin, ethyleneglycol monomethylether, ethyleneglycol monoethylether, ethyleneglycol n-propylether, ethyleneglycol dimethylether, ethyleneglycol diethylether, propyleneglycol monomethylether, propyleneglycol monoethylether, propyleneglycol monopropylether, propyleneglycol dimethylether, propyleneglycol diethylether, propyleneglycol dipropylether, etc.; ester solvents such as diethylcarbonate, methylacetate, ethylacetate, n-propylacetate, i-propylacetate, n-butylacetate, ethyl lactate, ethyleneglycol monomethyletheracetate, ethyleneglycol monoethylacetate, propyleneglycol monomethyletheracetate, propyleneglycol monomethyletheracetate, propyleneglycol monoethyletheracetate, propyleneglycol monopropyletheracetate, ethyleneglycol diacetate, propyleneglycol diacetate, etc.; amide solvents such as N-methylpyrrolidone, formamide, N-methylformamide, N-ethylformamide, N,N-dimethylformamide, N,N-diethylformamide, N-methylacetamide, N-ethylacetamide, N,N-dimethylacetamide, N,N-diethylacetamide, etc.

The organic solvents used in hydrolysis and condensation reaction can be used for forming a film after removing all or a specific amount of a specific solvent that has bad influences on coating properties, water, and reaction by-products. Additionally, according to purpose, after reaction, a secondary organic solvent may be added in a specific amount to use as a film-forming organic solvent, or after adding a secondary solvent and removing a specific organic solvent, water, and by-products, it can be used to form a film. One or more kinds of the organic solvents can be used in combination.

In the present invention, in order to promote the hydrolysis and condensation reaction, a catalyst is preferably used, being either an acid catalyst or a base catalyst. The acid catalyst is not specifically limited, and as examples, hydrochloric acid, nitric acid, sulfuric acid, phosphoric acid, fluoric acid, formic acid (hydrogen fluoride), acetic acid, propionic acid, butanoic acid, pentanoic acid, hexanoic acid, monochloroacetic acid, dichloroacetic acid, trichloroacetic acid, trifluoroacetic acid, oxalic acid, malonic acid, sulfonic acid, phtalic acid, fumaric acid, citric acid, maleic acid, oleic acid, methylmalonic acid, adipic acid, p-aminobenzoic acid, p-toluenesulfonic acid, etc. can be used.

The base catalyst preferably does not comprise metal ions having bad influences on semiconductor devices, such as sodium, potassium, etc., in the case the formed insulating film is to be used to manufacture a semiconductor device, and ammonia water or an organic amine is preferable. The organic amine is not specifically limited, and as examples, methylamine, ethylamine, propylamine, N,N-dimethylamine, trimethylamine, N,N-diethylamine, triethylamine, propylamine, N,N-dipropylamine, N,N-diethylamine, trimethylamine, triethylamine, tripropylamine, tetramethylammonium hydroxide, tetraethylammonium hydroxide, methylaminomethylamine, methylaminoethylamine, ethylaminomethylamine, ethylaminoethylamine, methylalcoholamine, ethylalcoholamine, propanolamine, N-methylmethylalcoholamine, N-ethylmethylalcoholamine, N-methylethylalcoholamine, N-ethylethylalcoholamine, N,N-dimethylmethylalcoholamine, N,N-diethylmethylalcoholamine, N-methyldimethanolamine, N-ethyldimethanolamine, N-methyldiethanolamine, N-ethyldiethanolamine, methoxymethylamine, ethoxymethylamine, methoxyethylamine, ethoxyethylamine, aniline, diazabicycloundecene, pyridine, pyrrole, piperidine, choline, pyrrolidine, piperazine, etc. can be used. Additionally, if an inorganic base is used, it is used as a coating composition after removing all metal ions after reaction.

The added amount of the catalyst can be controlled according to reaction conditions, and preferably 0.00001 to 2 moles per 1 mole of total silane compound are used. If the amount of the catalyst exceeds 2 moles, the reaction speed is very high even at a low concentration and thus the molecular weight is difficult to control, and gel may be easily produced. The acid and base catalyst used can be one or two or more kinds in combination. Alternatively, the hydrolysis-condensation reaction can be conducted by stages using an acid and a base. For example, after conducting the hydrolysis-condensation reaction with an acid, the reaction may be conducted with a base, or the hydrolysis-condensation reaction may be conducted with a base and then reaction may be conducted with an acid. Additionally, after respectively reacting with an acid and a base catalyst, the condensate can be mixed.

In addition, for hydrolysis of a silane compound, water is added. The amount of water used in hydrolysis of the silane compound is preferably 1 mole or more per 1 mole of the total silane compound, and more preferably 1 to 50 moles, and still more preferably 1.5 to 50 moles. If the amount of water is less than 1 mole, the hydrolysis-condensation reaction does not occur, and mechanical properties of the insulating film may be deteriorated. The water can be added intermittently or continuously. A catalyst may be previously added to the organic solvent, or it may be previously dissolved or dispersed in water.

The hydrolysis-condensation reaction is preferably conducted at 0 to 100° C., and more preferably at 15 to 80° C. The weight average molecular weight of the obtained hydrolysis condensate can be 500 or more compared to the conversion molecular weight of polystyrene. If the polymer is applied as an insulating film, the molecular weight is preferably 500 to 1,000,000.

The insulating film-forming composition of the present invention may further comprise a specific amount of colloidal silica and a surfactant, etc. according to its purpose.

The composition of the present invention comprises 2 to 60 wt % of total solid concentration, and preferably 5 to 40 wt %, considering the film thickness and maintenance stability of an insulating film. The solid concentration can be controlled by kind and amount of organic solvent.

The present invention also provides an insulating film for a semiconductor device comprising the nanopore-forming material.

According to the present invention, an organosilicate polymer is dissolved in an organic solvent, and the nanopore-forming material is dissolved therein to prepare a composition for forming an insulating film, and then it is coated on a substrate such as a silicon wafer, a $SiO_2$ wafer, a SiN wafer, a semiconductor, etc. to form an insulating film having low dielectric properties.

The insulating film can be formed by a spin-coating method, an immersion method, a roll-coating method, a spray method, etc., and a film can be formed with a specific thickness using these methods. In order to prepare a multi-layered circuit interlayer insulating film for a semiconductor device, the spin-coating method is suitable.

The thickness of the insulating film can be controlled by changing the viscosity of the composition and the rotation speed of the spin coater, and it is preferably 0.1 to 2 μm in the case it is used for a multi-layered circuit interlayer insulating film for a semiconductor device.

According to the present invention, the composition is coated and then dried and cured to form an organosilicate polymer insulating film of a three-dimensional structure, and it is fired to decompose the pore-forming material and further cure the organosilicate film. The drying process commonly comprises a pre-bake process and a soft-bake process. During the pre-bake process, used organic solvent is gradually evaporated; during the soft-bake process, specific amounts of functional groups are crosslinked; and during the subsequent curing process, remaining functional groups are further reacted. Drying is conducted at 30 to 200° C., and curing and firing are conducted at 200° C. or more, and preferably 200 to 500° C.

The drying, curing, and firing processes can be continuously conducted while elevating the temperature at a constant rate, or they can be conducted intermittently. If conducted intermittently, drying, curing, and firing processes are preferably conducted respectively for 1 minute to 5 hours. Heating can be conducted using a hot plate, an oven, a furnace, etc., and it can be conducted under an inert gas atmosphere such as with nitrogen, argon, helium, etc.; under an oxygen atmosphere such as with an oxygen-containing gas (for example, air); under a vacuum condition; or under an ammonia or hydrogen-containing gas atmosphere. The heating, drying and firing processes can be conducted by the same heating methods, or they can be conducted by different methods.

In addition, surface treatment can be conducted after the drying and firing processes, if necessary, in order to minimize the amount of hydroxy groups inside the insulating film. The surface treatment can be conducted by firing using generally known silylated compounds such as hexamethyldisilazane, alkylalkoxysilane, and alkylacetoxysilane, or under a reducing atmosphere such as with hydrogen or a fluorine-containing gas. Silylation of an insulating film can be conducted by immersion in a silylated compound or a silylated compound diluted in solvent, or spin-coating thereon, or it can be conducted under a silylated compound vapor atmosphere, and after silylation, the insulating film is preferably heated at 100 to 400° C.

The insulating film obtain by the above method has superior insulating properties, and superior uniformity, crack resistance, and surface strength of the coated film, and thus it is suitable for use as an interlayer insulating film for semiconductor devices such as for LSI, system LSI, DRAMs, SDRAMs, RDRAMs, D-RDRAMs, etc., a protection film for a surface coating film of a semiconductor device, an interlayer insulating film for a multi-layered wiring substrate, a protection film or an insulation preventing film, etc for a liquid crystal display device.

The present invention will be explained in more detail with reference to the following Examples. However, these are to illustrate the present invention, and the present invention is not limited to them.

EXAMPLES

Example 1

Preparation of Pore-Forming Material

A solution in which triazine trichloride (0.922 g, 5.0 mmole) was dissolved in 30 ml of toluene was slowly dripped into a solution in which 12.00 g (16.00 mmole, 3.2 equivalents) of polyethyleneglycol (PEG, average molecular weight 750) and diisopropylethylamine (DIPEA, 2.13 g) were dissolved in 200 ml of toluene, at 0° C. for 20 minutes. The reaction solution was reacted overnight while reflux-stirring, and after cooling to room temperature, it was distilled under reduced pressure to remove solvent and purified using a reprecipitation method in diethylether and hexane.

(Preparation of Organosilicate Polymer)

To 18 ml of tetrahydrofuran, 10 g of methyltrimethoxysilane and 2.24 g of tetramethoxysilane were added, and 0.06 g of nitric acid and 10.57 g of high purity water were added, and then they were reacted at 50° C. overnight. The reaction solution was diluted with ether and then washed with water until the pH became neutral. Water was removed from the obtained organic layer with a drying agent, and then organic solvent was completely removed under vacuum to obtain a powder product.

(Manufacture of Insulating Film)

The organosilicate polymer synthesized by the above process was completely dissolved in methyl isobutylketone solvent, and then the pore-forming material synthesized in the above was dissolved in the solution in the amount of 20 wt % of total solid contents. The concentration of the total solution was controlled to 20 to 25%. After sufficiently mixing the solution, it was spin-coated on a silicon wafer to obtain a thin film, and cured at 200° C. and 430° C. respectively for 1 hour under a nitrogen atmosphere to manufacture an insulating film. After confirming extinction of organic molecules by FTIR, the state of the cured film was observed with an optical microscope and an electron microscope, and the results are shown in FIG. 1. The dielectric properties of the coated film were measured by the MIS (metal/insulator/semiconductor) method. As shown in FIG. 1, the cured film was a transparent film without layer separation, pores of 5 nm or more could not be found with the electron microscope, and the dielectric constant was low at 2.5 or less.

Example 2

Preparation of Pore-Forming Material

A solution in which triazine trichloride (0.922 g, 5.0 mmole) was dissolved in 20 ml of tetrahydrofuran was slowly dripped into 200 ml of a tetrahydrofuran solution in which 3.94 g (5.25 mmole, 1.05 equivalents) of polyethyleneglycol (PEG, average molecular weight 750) and diisopropylethylamine (DIPEA, 0.71 g) were dissolved, at 0° C. for 20 minutes, and then they were reacted overnight while stirring at room temperature. The temperature was lowered to 0° C., and 0.34 ml (5.05 mmole, 1.01 equivalents) of ethylenediamine were added, and the solution was then reflux-stirred for 24 hours. The reaction solution was distilled under reduced pressure to remove solvent therefrom, and purified by a reprecipitation method in diethylether and hexane.

(Preparation of Organosilicate Polymer)

To 18 ml of tetrahydrofuran, 10 g of methyltrimethoxysilane and 2.79 g of tetraethoxysilane were added, 0.48 g of maleic acid and 10.57 g of deionized water were added, and then they were reacted at 50° C. overnight. The reaction solution was diluted with ether and then washed with water until the pH became neutral. Water was removed from the obtained organic layer with drying agent, and then organic solvent was completely removed under vacuum to obtain a powder product.

(Manufacture of Insulating Film)

The organosilicate polymer synthesized by the above process was completely dissolved in methylisobutylketone solvent, and then the pore-forming material was dissolved in the solution in an amount of 20 wt % of the total solid contents. The concentration of the total solution was controlled to 20~25%. After sufficiently mixing the solution, it was spin-coated on a silicon wafer to obtain a thin film, and cured at 200° C. and 430° C. respectively for 1 hour under a nitrogen atmosphere to manufacture an insulating film. After confirming extinction of organic molecules by FTIR, the state of the cured film was observed with an optical microscope and an electron microscope, and dielectric properties of the coated film were measured by the MIS (metal/insulator/semiconductor) method. The cured film was a transparent film without layer separation, pores of 5 nm or more could not be found with the electron microscope, and the dielectric constant was low at 2.5 or less.

Table 1 shows dielectric constant of the insulating films comprising the pore-forming materials prepared by Examples 1 and 2.

As can be seen from Examples 1 and 2, when manufacturing an organosilicate polymer film using the pore-forming material prepared by the process of the present invention, a low dielectric porous insulating film that does not show layer separation during the curing process and that has very small pores of a few nanometers or less so that formed pores cannot be observed with an electron microscope can be formed.

[Effects of The Invention]

As explained, the pore-forming material of the present invention is easy to synthesize, and the molecular weight, micro structure, and microenvironment, etc. are easy to control, and thus it is suitable for a material for forming very small pores of nano size. Accordingly, if it is applied as an organosilicate insulating film, an insulating film for a semiconductor having little layer separation, small pores, and superior insulating properties can be obtained.

The invention claimed is:

1. A nanopore-forming material comprising a triazine-based functional group, wherein the nanopore-forming material is selected from the group consisting of triazine-based linear organic molecules or polymers, triazine-based crosslinked organic polymers, triazine-based hyperbranched organic molecules or polymers, triazine-based dendrimer organic materials, and a mixture thereof, wherein the nanopore-forming material has a pore size of 0.5 to 100 mm; and has a repeating unit selected from the group consisting of a compound represented by the following Chemical Formula 1, a compound represented by the following Chemical Formula 2, and a compound represented by the following Chemical Formula 3;

[Chemical Formula 1]

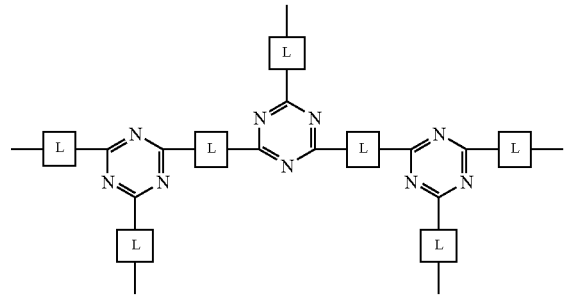

TABLE 1

| Example | pore-forming material (g) | organosilicate (g) | total (g) | percentage of the nano-pores (%) | refractive index (632.8 nm) | dielectric constant |
| --- | --- | --- | --- | --- | --- | --- |
| 1-1 | 0 | 1.5171 | 1.5171 | 0.0 | 1.376 | 2.80 |
| 1-2 | 0.1514 | 1.3501 | 1.5015 | 10.1 | 1.348 | 2.62 |
| 1-3 | 0.3095 | 1.2015 | 1.511 | 20.5 | 1.309 | 2.45 |
| 1-4 | 0.4479 | 1.0518 | 1.4997 | 29.9 | 1.273 | 2.30 |
| 1-5 | 0.5988 | 0.8963 | 1.4951 | 40.1 | 1.240 | 2.15 |
| 2-1 | 0 | 1.5032 | 1.5032 | 0.0 | 1.391 | 2.80 |
| 2-2 | 0.155 | 1.3562 | 1.5112 | 10.3 | 1.360 | 2.66 |
| 2-3 | 0.2981 | 1.2022 | 1.5003 | 19.9 | 1.323 | 2.50 |
| 2-4 | 0.4488 | 1.0445 | 1.4933 | 30.1 | 1.286 | 2.29 |
| 2-5 | 0.7454 | 0.7512 | 1.4966 | 49.8 | 1.232 | 2.02 |

-continued

[Chemical Formula 2]

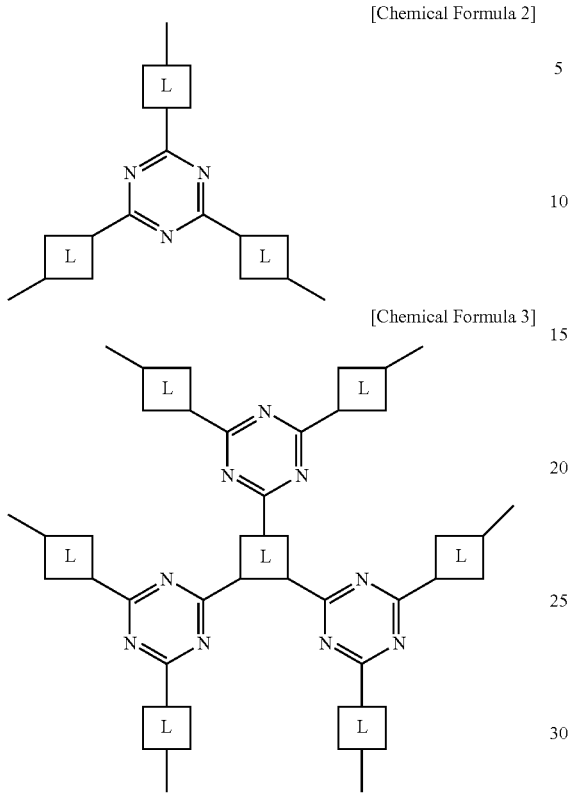

wherein L is one or more kinds of an organic group selected from the group consisting of polyethylene glycol and ethylenediamine, and wherein the organic group is thermolyzed at 200 to 450° C.

2. A coating composition for forming an insulating film for a semiconductor device, comprising:
   a) the triazine-based nanopore-forming material claim 1;
   b) an organosilicate polymer comprising a hydrolysis-condensation polymerization product of a silane compound of one or more kinds selected from the group consisting of a compound represented by the following Chemical Formula 4, a compound represented by the following Chemical Formula 5, and a compound represented by the following Chemical Formula 6; and c) an organic solvent:

$$SiR^1_p R^2_{4-p}$$ [Chemical Formula 4]

wherein $R^1$ is a hydrogen, fluorine, aryl, vinyl, allyl, or straight or branched C1–4 alkyl substituted or unsubstituted with fluorine; $R^2$, which is an hydrolysable group, is an acetoxy, hydroxy, or straight or branched C1–4 alkoxy, and p is an integer of 0 to 2, $$R^3_q R^4_{3-q} Si-M-SiR^5_r R^6_{3-r}$$ [Chemical Formula 5]

wherein $R^3$ and $R^5$ are independently or simultaneously a hydrogen, fluorine, aryl, vinyl, allyl, or straight or branched C1–4 alkyl substituted or unsubstituted with fluorine; $R^4$ and $R^6$ are independently or simultaneously an acetoxy, hydroxy, or straight or branched C1–4 alkoxy; M is C1–6 alkylene or phenylene; and q and r are independently or simultaneously integers of 0 to 2,

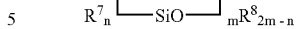 [Chemical Formula 6]

wherein $R^7$ is a hydrogen, fluorine, aryl, vinyl, allyl, or straight or branched C1–4 alkyl substituted or unsubstituted with fluorine; n an m are independently or simultaneously integers of 3 to 10; $R^8$ is an alkoxy, hydroxy, or $-(CH_2)_a SiR^9_b R^{10}_{3-b}$ (wherein $R^9$ is a hydrogen, fluorine, aryl, vinyl, allyl, or straight or branched C1–4 alkyl substituted or unsubstituted with fluorine; $R^{10}$ is acetoxy, hydroxy, or straight or branched C1–4 alkoxy substituted or unsubstituted with fluorine; a is an integer of 1 to 6; and b is an integer of 0 to 2).

3. The coating composition for forming an insulating film according to claim 2, wherein the a) triazine-based functional group containing a nanopore-forming material is contained in an amount of 2 to 80 wt %.

4. A process for manufacturing an insulating film for a semiconductor device comprising:
   a) providing a solution of a composition for forming an insulating film comprising
      i) an organosilicate polymer comprising a hydrolysis-condensation polymerization product of a silane compound of one or more kinds selected from the group consisting of a compound of the following Chemical Formula 4, a compound of the following Chemical Formula 5, and a compound of the following Chemical Formula 6,
      ii) the triazine-based nanopore-forming material of claim 1, and
      iii) an organic solvent;
   b) coating the a) solution on a substrate of a semiconductor device to form an insulating film; and
   c) drying and firing the insulating film formed in step b):

$$SiR^1_p R^2_{4-p}$$ [Chemical Formula 4]

wherein $R^1$ is a hydrogen, fluorine, aryl, vinyl, allyl, or straight or branched C1–4 alkyl substituted or unsubstituted with fluorine, $R^2$, which is an hydrolysable group, is acetoxy, hydroxy, or straight or branched C1–4 alkoxy; and p is an integer of 0 to 2, $$R^3_q R^4_{3-q} Si-M-SiR^5_r R^6_{3-r}$$ [Chemical Formula 5]

wherein $R^3$ and $R^5$ are independently or simultaneously a hydrogen, fluorine, aryl, vinyl, allyl, or straight or branched C1–4 alkyl substituted or unsubstituted with fluorine; $R^4$ and $R^6$ are independently or simultaneously acetoxy, hydroxy, or straight or branched C1–4 alkoxy; M is C1–6 alkylene or phenylene; and q and r are independently or simultaneously integers of 0 to 2,

 [Chemical Formula 6]

wherein $R^7$ is a hydrogen, fluorine, aryl, vinyl, allyl, or straight or branched C1–4 alkyl substituted with fluorine or unsubstituted; n and m are independently or simultaneously integers of 3 to 10; $R^8$ is an alkoxy, hydroxy, or $-(CH_2)_a SiR^9_b R^{10}_{3-b}$ (wherein $R^9$ is a hydrogen, fluorine, aryl, vinyl, allyl, or straight or branched C1–4 alkyl substituted or unsubstituted with fluorine; $R^{10}$ is acetoxy, hydroxy, or straight or branched C1–4 alkoxy substituted or unsubstituted with fluorine; a is an integer of 1 to 6; and b is an integer of 0 to 2).

5. An insulating film for a semiconductor device manufactured by the process of claim 4.

6. A semiconductor device comprising the insulating film of claim 5.

* * * * *